United States Patent
Lee

(10) Patent No.: US 7,471,223 B2
(45) Date of Patent: Dec. 30, 2008

(54) DELTA-SIGMA MODULATOR CIRCUITS IN WHICH DITHER IS ADDED TO THE QUANTIZATION LEVELS OF METHODS OF OPERATING THE SAME

(75) Inventor: Yong-Hee Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/506,515

(22) Filed: Aug. 18, 2006

(65) Prior Publication Data

US 2007/0040718 A1    Feb. 22, 2007

(30) Foreign Application Priority Data

Aug. 20, 2005  (KR)  ............... 10-2005-0076527

(51) Int. Cl.
*H03M 1/20* (2006.01)

(52) U.S. Cl. .............. 341/131; 341/143; 341/144; 341/155

(58) Field of Classification Search .......... 341/131, 341/143, 144, 155
See application file for complete search history.

(56) References Cited

U.S. PATENT DOCUMENTS

| | | | | |
|---|---|---|---|---|
| 5,057,840 A * | 10/1991 | Ledzius et al. | ............ | 341/144 |
| 5,073,777 A * | 12/1991 | Fukuhara et al. | ............ | 341/131 |
| 5,530,442 A * | 6/1996 | Norsworthy et al. | ........ | 341/131 |
| 6,351,229 B1 * | 2/2002 | Wang | ............ | 341/143 |
| 6,473,019 B1 * | 10/2002 | Ruha et al. | ............ | 341/143 |
| 6,710,729 B1 * | 3/2004 | Chen | ............ | 341/143 |
| 6,744,392 B2 * | 6/2004 | Melanson | ............ | 341/143 |
| 6,825,784 B1 * | 11/2004 | Zhang | ............ | 341/131 |
| 6,992,606 B2 * | 1/2006 | Zogakis et al. | ............ | 341/131 |
| 7,002,497 B2 * | 2/2006 | Brooks | ............ | 341/131 |
| 7,116,260 B2 * | 10/2006 | Luh | ............ | 341/155 |
| 7,212,142 B2 * | 5/2007 | Brooks | ............ | 341/143 |
| 7,224,304 B2 * | 5/2007 | Schoner | ............ | 341/144 |
| 2004/0239540 A1 * | 12/2004 | Ku | ............ | 341/143 |
| 2005/0007267 A1 * | 1/2005 | Zogakis et al. | ............ | 341/143 |
| 2005/0128111 A1 * | 6/2005 | Brooks | ............ | 341/131 |
| 2006/0164276 A1 * | 7/2006 | Luh | ............ | 341/155 |

FOREIGN PATENT DOCUMENTS

KR  10-2004-0058118  7/2004

OTHER PUBLICATIONS

Notice to Submit Response for Korean Application No. 10-2005-0076527; Mailed Oct. 25, 2006.

* cited by examiner

*Primary Examiner*—Linh V Nguyen
(74) *Attorney, Agent, or Firm*—Myers Bigel Sibley & Sajovec, P.A.

(57) ABSTRACT

A delta-sigma modulator circuit includes an n-level quantizer circuit that is configured to generate a quantized output signal responsive to an input signal. The n-level quantizer circuit includes n adder circuits that are configured to add a dither signal to n quantization levels to generate n dithered quantization levels, respectively and n comparator circuits that are configured to compare the input signal with the n dithered quantization levels to generate the quantized output signal.

30 Claims, 18 Drawing Sheets

DELTA-SIGMA MODULATOR CIRCUITS IN WHICH DITHER IS ADDED TO THE QUANTIZATION LEVELS OF METHODS OF OPERATING THE SAME

RELATED APPLICATION

This application claims the benefit of and priority to Korean Patent Application No. 10-2005-0076527, filed Aug. 20, 2005, in the Korean Intellectual Property Office, the disclosure of which is hereby incorporated herein by reference as if set forth in its entirety.

FIELD OF THE INVENTION

The present invention relates generally to modulation circuits and, more particularly, to delta-sigma modulation circuits and methods of operating the same.

BACKGROUND OF THE INVENTION

Delta-sigma modulation is a kind of analog-to-digital (ADC) or digital-to-analog (DAC) conversion derived from delta modulation. In general, the ADC or DAC circuits that are used to implement the delta-sigma modulation technique can be designed using relatively low-cost CMOS components. As a result, delta-sigma modulation has come into more widespread use as silicon technology has progressed. One principle of delta-sigma modulation is to make an evaluation of a signal, measure the error, integrate the error, and then compensate for the error. The mean output value is equal to the mean input value if the integral of the error is finite. The number of integrator, which corresponds to the number of feedback loops, indicates the order of the delta-sigma modulator.

To provide a high definition transfer of signals, delta-sigma modulators may use oversampling and/or noise shaping techniques. As shown in FIG. 1, oversampling may reduce quantization errors in-band using a high sampling frequency because the sum of the quantization error is constant within the sampling frequency. Noise shaping techniques push the quantization error out of the in-band. The amount of noise shaping applied is dependent on the delta-sigma modulator's order. By using both oversampling and noise shaping, the noise rate in the signal band may be reduced and the signal-to-noise ratio may be improved.

FIG. 2 illustrates a conventional delta-sigma modulator that comprises a loop filter 10, subtractor circuit 15, adder circuit 12, and an N-bit quantizer 20 that are connected as shown. The subtractor 15 computes the difference between the input signal Xin and the output from the quantizer 20. The difference is cumulated in the loop filter 10 and the cumulated difference is provided as an input to the quantizer 20. Unfortunately, the modulator of FIG. 2 includes a "dead zone," which corresponds to some inputs that cannot be precisely quantized due to the loop filter's order and the characteristics of the quantizer 20. The conventional delta-sigma modulator may also be adversely affected by pattern noise or idle channel noise, i.e., a periodic spectrum that has a higher magnitude than the quantization error. To address such deficiencies, dither signals may be used as shown in FIG. 2 (DITHER1 11, DITHER2 13, and DITHER3 21) or more advanced loop filters may be used.

In an environment affected by pattern noise such as that shown in FIG. 3, a conventional delta-sigma modulator in response to static or direct current (DC) inputs attempts to equal on average the input level with repetitive patterns. A higher order modulator may decrease pattern noise, but typically cannot remove it completely. As discussed above, dithering may be included at the input to the quantizer. Dithering signals, however, are pseudo-random noise signals (non-periodic noise signals) that are themselves essentially a noise source. As shown in FIG. 2, if dither signals are added at the subtractor 15, the adder 12, and in the feedback path, then the magnitude of the input Xin is reduced by the added dither amount. Even though unwanted tone noise may be reduced by the dithering signals, the white noise may be increased and, because the magnitude of the input signal Xin is reduced, the signal-to-noise (SNR) ratio is reduced. Moreover, using a higher order modulator and/or dithering increases the complexity of the modulator circuit.

Another source of errors in delta-sigma modulators comes from the internal linearity error of a DAC as the resolution of the quantizer increases. Noise shaping cannot be used to address the internal linearity errors of the DAC so the error is output to an output terminal. To reduce the linearity error of a DAC, dynamic weight averaging (DWA) technology has been used.

FIG. 4 illustrates the conventional delta-sigma modulator of FIG. 2 that further includes a DWA capability. Referring to FIG. 4, the delta-sigma modulator includes a subtractor 15, loop filter 10, adder 12, N-bit quantizer 20, thermometer decoder 30, DWA decoder 40, and DAC that are connected as shown. Dither is added to the input of the quantizer 20 and the DAC is implemented as an analog low pass filter (LPF). The DWA decoder 40 shifts and outputs the output of the thermometer decoder 30. Differences in the number of zeros and ones input to the DWA decoder 40 determine the output of the DWA decoder 40. If the number of zeros and ones are the same, then the DAC 50 output is "0." If, however, the number of ones exceeds the number of zeros, then the DAC 50 output is "1."

The left bits of the thermometer decoder 30 are "1 (+err)", "1," "1," "1," and "1." If the DWA decoder 40 is not used and the DAC 50 is subject to linearity errors, then the errors cumulate in the DAC 50 in a unidirectional fashion and may be viewed as tone noise. The left bits of the DWA decoder 40 are "0 (−err)", "1 (+err)," "0," "1," and "1." If the output of the thermometer decoder 30 is input to the DWA decoder 40, then the cumulated errors in the DAC 50 may be reduced. Adding a dither signal to the input of the quantizer has been used to address the problem of idle channel noise and tone noise in a multi-bit DAC. For example, FIG. 5 is a reproduction of FIG. 1A from U.S. Pat. No. 6,473,019 to Ruha et al. of a multi-bit sigma-delta modulator circuit in which a dither signal is added to the input of a quantizer. Unfortunately, in such configurations the magnitude of the input signal is typically reduced so that the maximum swing range is not exceeded when the dither signal is added to the input signal. As a result, white noise is increased and the SNR is reduced.

SUMMARY

According to some embodiments of the present invention, a delta-sigma modulator circuit includes an n-level quantizer circuit that is configured to generate a quantized output signal responsive to an input signal. The n-level quantizer circuit includes n adder circuits that are configured to add a dither signal to n quantization levels to generate n dithered quantization levels, respectively, and n comparator circuits that are configured to compare the input signal with the n dithered quantization levels to generate the quantized output signal.

In other embodiments, the delta-sigma modulator circuit further comprises an integrator that is configured to integrate a difference between a modulator input signal and the quantized output signal to generate the input signal.

In still other embodiments, the integrator comprises a loop filter.

In still other embodiments, the delta-sigma modulator further comprises an interpolator circuit that is configured to generate the modulator input signal responsive to a digital input signal.

In still other embodiments, the interpolator circuit comprises a digital low pass filter.

In still other embodiments, the delta-sigma modulator circuit further comprises a digital-to-analog converter (DAC) circuit that is configured to generate an analog output signal responsive to the quantized output signal.

In still other embodiments, the delta-sigma modulator circuit further comprises a dither generator that is configured to generate the dither signal and a scaling circuit that is configured to multiply the dither signal by a scaling factor to generate the scaled dither signal. The n adder circuits are configured to add the scaled dither signal to the n quantization levels to generate the n dithered quantization levels, respectively.

In still other embodiments, the delta-sigma modulator circuit further comprises a scaler block that is configured to generate the scaling factor based on a scale control signal.

In still other embodiments, the scaling circuit comprises n scaling units that are associated with the n adder circuits, respectively, the n scaling units being configured to multiply the dither signal by n scaling factors to generate n scaled dither signals. The n adder circuits are further configured to add the n scaled dither signals to the n quantization levels to generate the n dithered quantization levels.

In still other embodiments, the n scaling factors have different values.

In still other embodiments, at least two of the n scaling factors have a same value.

In still other embodiments, scaling factors associated with quantization levels between a first threshold and a second threshold are greater than scaling factors associated with quantization levels less than the first threshold and greater than the second threshold.

In still other embodiments, the dither signal comprises non-periodic pseudo random noise.

In still other embodiments, the delta-sigma modulator circuit further comprises a digital-to-analog converter (DAC) that is configured to generate an analog output signal responsive to the quantized output signal and an integrator that is configured to integrate a difference between a modulator input signal and the analog output signal to generate the input signal.

In still other embodiments, the integrator comprises a loop filter.

In still other embodiments, the delta-sigma modulator circuit further comprises an analog low pass filter that is configured to generate the modulator input signal responsive to an analog input signal.

In still other embodiments, the delta-sigma modulator circuit further comprises a decimator circuit that is configured to generate a digital output signal responsive to the quantized output signal.

In still other embodiments, the decimator circuit comprises a digital low pass filter.

In further embodiments, a delta-sigma modulator is operated by generating a quantized output signal responsive to an input signal, comprising adding a dither signal to n quantization levels to generate n dithered quantization levels, respectively and comparing the input signal with the n dithered quantization levels to generate the quantized output signal.

In still further embodiments, the method further comprises integrating a difference between a modulator input signal and the quantized output signal to generate the input signal.

In still further embodiments, the method further comprises interpolating a digital input signal to generate the modulator input signal.

In still further embodiments, the method further comprises converting the quantized output signal to an analog output signal.

In still further embodiments, the method further comprises generating the dither signal and multiplying the dither signal by a scaling factor to generate a scaled dither signal. Furthermore, adding the dither signal to the n quantization levels comprises adding the scaled dither signal to the n quantization levels.

In still further embodiments, the method further comprises generating the scaling factor based on a scale control signal.

In still further embodiments, multiplying the dither signal by the scaling factor comprises multiplying the dither signal by n scaling factors to generate n scaled dither signals. Furthermore, adding the scaled dither signal to the n quantization levels comprises adding the n scaled dither signals to the n quantization levels to generate the n dithered quantization levels. In still further embodiments, the n scaling factors have different values.

In still further embodiments, at least two of the n scaling factors have a same value.

In still further embodiments, scaling factors associated with quantization levels between a first threshold and a second threshold are greater than scaling factors associated with quantization levels less than the first threshold and greater than the second threshold.

In still further embodiments, the dither signal comprises non-periodic pseudo random noise.

In still further embodiments, the method further comprises converting the quantized output signal to an analog output signal and integrating a difference between a modulator input signal and the analog output signal to generate the input signal.

In still further embodiments, the method further comprises low pass filtering an analog input signal to generate the modulator input signal.

In still further embodiments, the method further comprises generating a digital output signal responsive to the quantized output signal.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
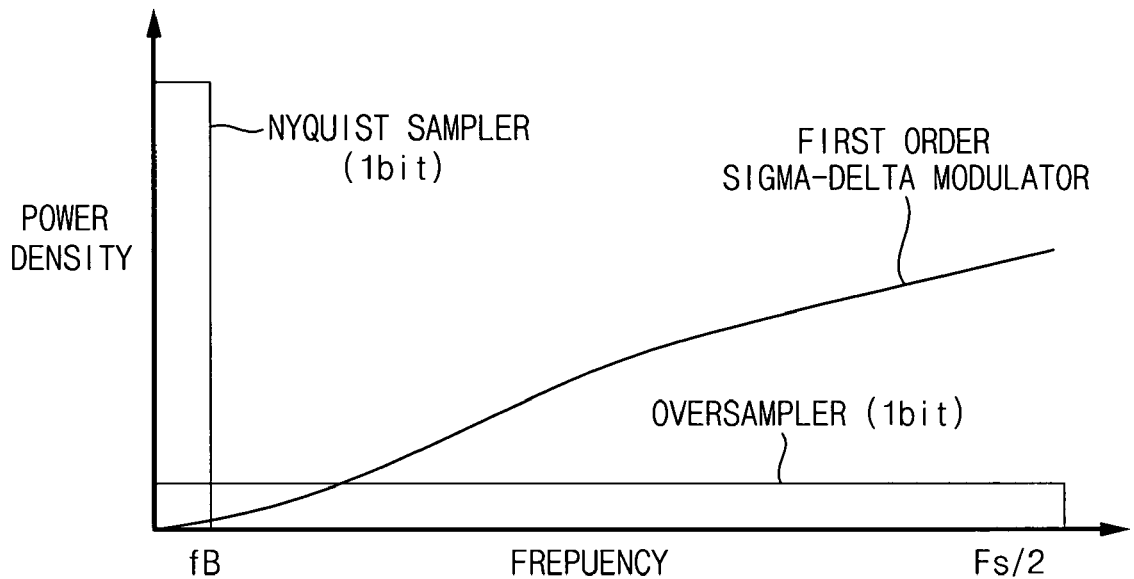
FIG. 1 is graph of power density versus frequency for a first-order sigma-delta noise shaper circuit.
Figure 2:
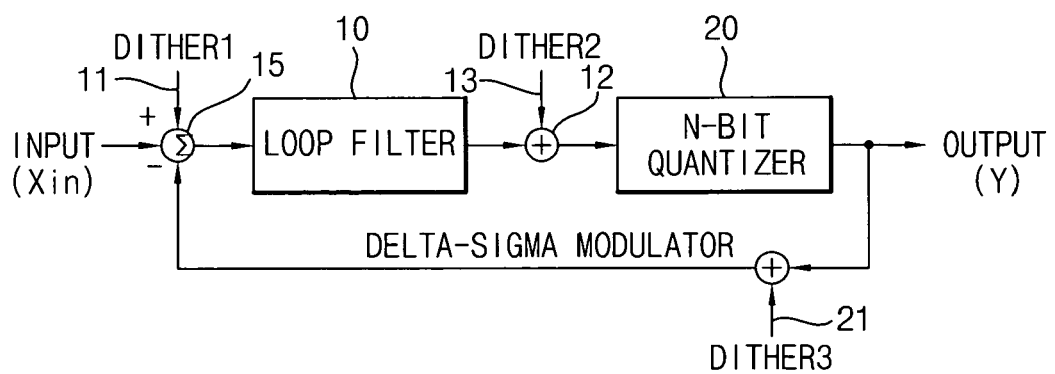
FIG. 2 is a block diagram of a conventional delta-sigma modulator circuit.
Figure 3:
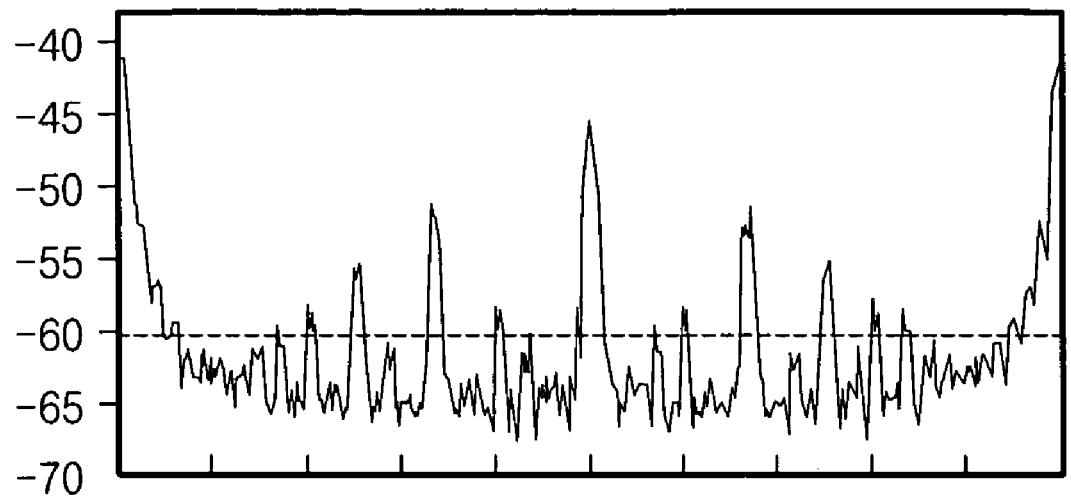
FIG. 3 is a graph of pattern noise.
Figure 4:
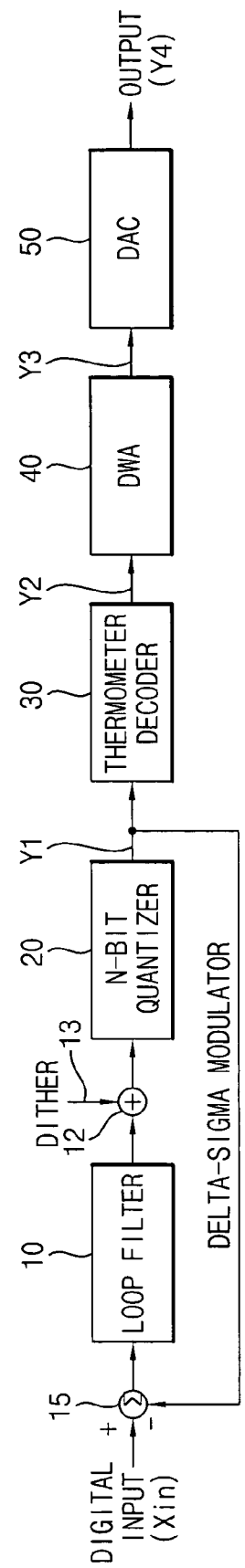
FIG. 4 is a block diagram of a conventional delta-sigma digital-to-analog converter circuit with a dynamic weight averaging block.
Figure 5:
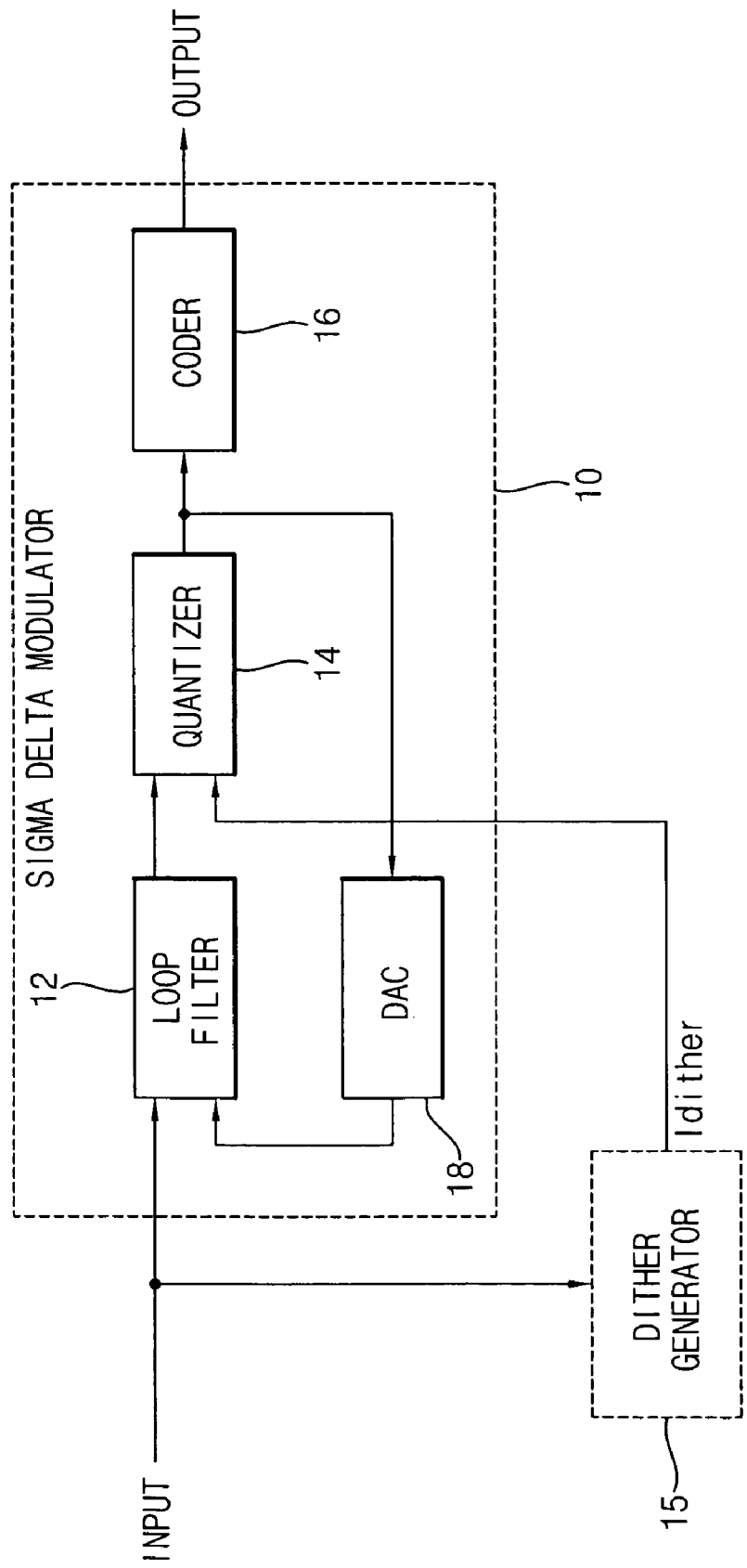
FIG. 5 is a reproduction of FIG. 1A from U.S. Pat. No. 6,473,019 to Ruha et al.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention stem from a realization that it may be advantageous in a delta-sigma modulator circuit to add dither to the quantization levels used by a quantizer circuit rather than the input signal to the quantizer circuit. By following such an approach, the magnitude of the input signal need not be reduced and the signal-to-noise ratio (SNR) of the delta-sigma modulator circuit may not be reduced.

Figure 6:
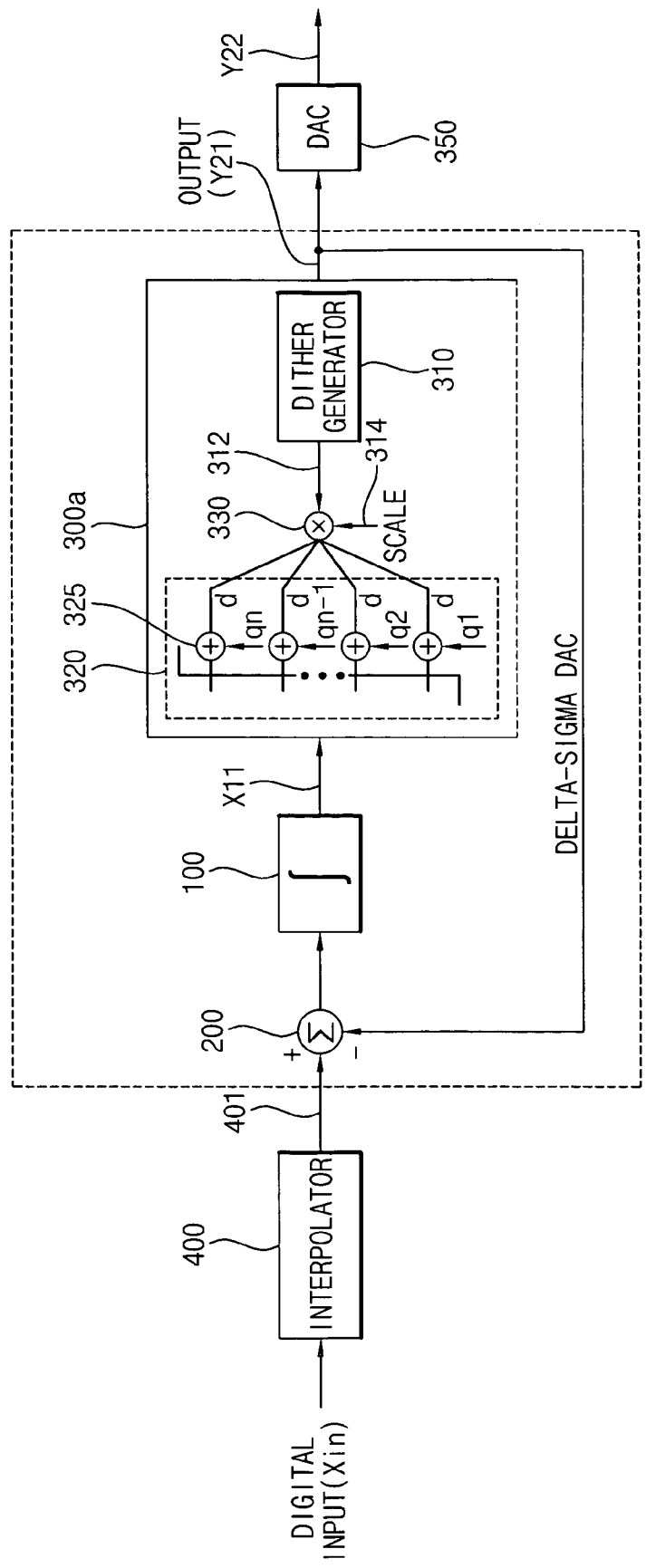
FIG. 6 is a block diagram of a delta-sigma digital-to-analog converter circuit in accordance with some embodiments of the present invention.

Referring to FIG. 6, a delta-sigma modulator digital-to-analog converter (DAC) circuit, in accordance with some embodiments of the present invention, includes an interpolator 400, a subtractor 200, an integrator or digital loop filter 100, a converter 300a and a DAC 350 that are connected as shown. The functionality provided by the interpolator 400, subtractor 200, integrator 100, and DAC 350 are similar to those in conventional delta-sigma modulator circuits. The interpolator 400 interpolates the input signal Xin so as to oversample the input signal Xin. In some embodiments, the interpolator 400 may be implemented as a low-pass filter (LPF). The integrator 100 integrates the difference between the interpolated input signal and a feedback signal. The feedback loop is included to reduce a difference between the input signal Xin and the output of a quantizer circuit 320. The difference is accumulated in the integrator 100, which may be a digital LPF in accordance with some embodiments of the present invention.

The converter 300a may be viewed as an n-level quantizer circuit in which dither is added directly to the quantization levels. The integrated input signal is quantized using the dithered quantization levels and a quantized output signal is generated for use as a feedback signal and as an input to the DAC 350.

Figure 7A:
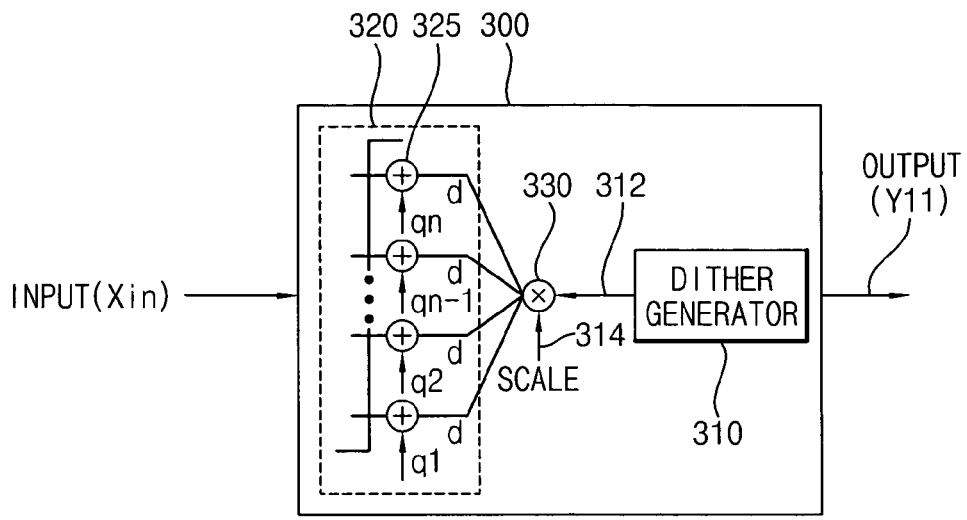
FIGS. 7A-7C are block diagrams of converter circuits for use in delta-sigma digital-to-analog converter circuits in accordance with various embodiments of the present invention.
Figure 7B:
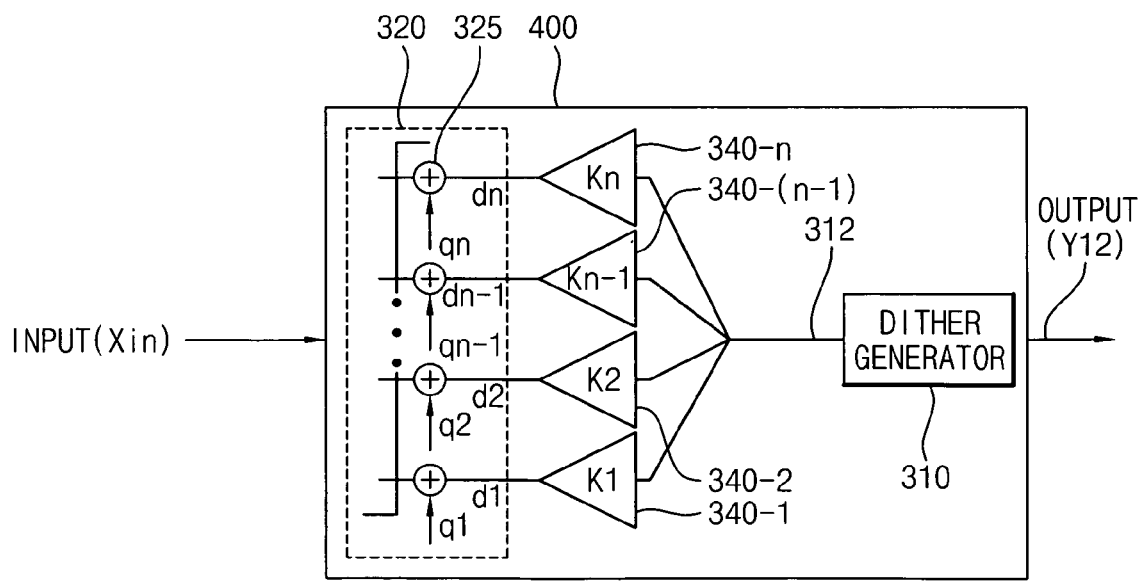
Figure 7C:
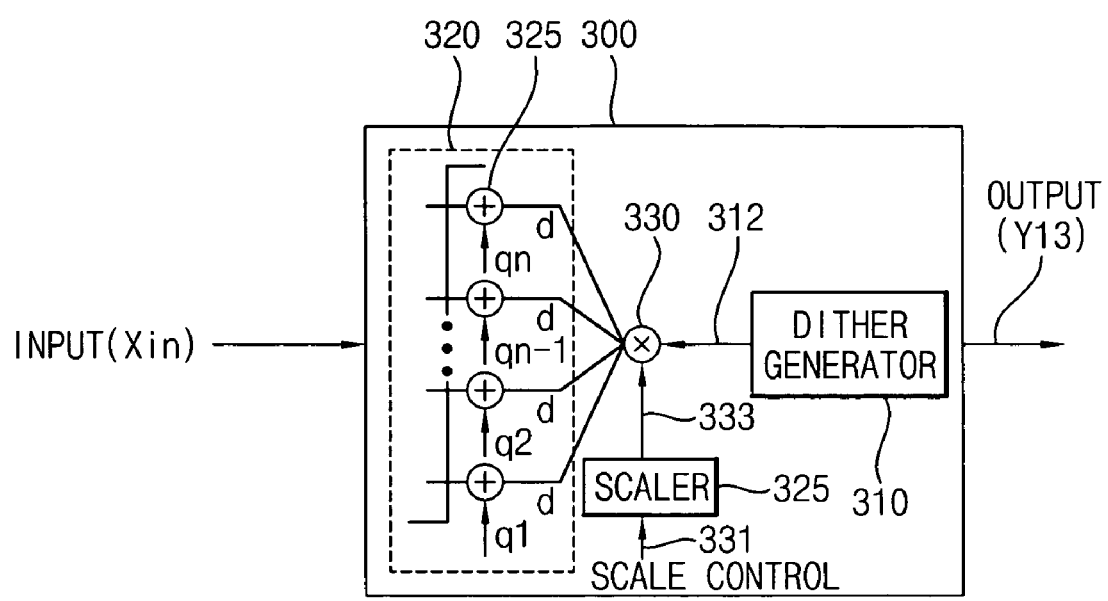

FIGS. 7A-7C illustrate the converter 300a of FIG. 6 in accordance with various embodiments of the present invention. Referring now to FIG. 7A, the converter 300a is the same as the converter 300a shown in FIG. 6. The converter 300a includes a dither generator 310, a multiplier 330, and a quantizer 320 that are connected as shown. The dither generator 310 is configured to generate a dither signal 312, which may be a non-periodic, pseudo random noise signal. The multiplier 330 scales the dither signal 312 to generate a second dither signal d by multiplying the first dither signal 312 by a scaling factor SCALE. The scaling factor SCALE may be a real number including zero in accordance with some embodiments of the present invention. The quantizer 320 includes a n adder circuits 325 that add the second dither signal d to the $2^N$ quantization levels (q1, q2, ... qn, n=$2^N$) to generate n dithered quantization levels and n comparator circuits that are configured to compare the input signal with the n dithered quantization levels to generate the quantized output signal. Thus, the converter 300a quantizes the input Xin using the dithered quantization levels and outputs the quantized output signal Y11. In some embodiments, the first dither signal 312 may be directly input to the quantizer 320 without any scaling applied. Moreover, N may be any integer including zero as the invention may be applied to multi-bit quantizers or a 1-bit quantizer in accordance with various embodiments.

Figure 8A:
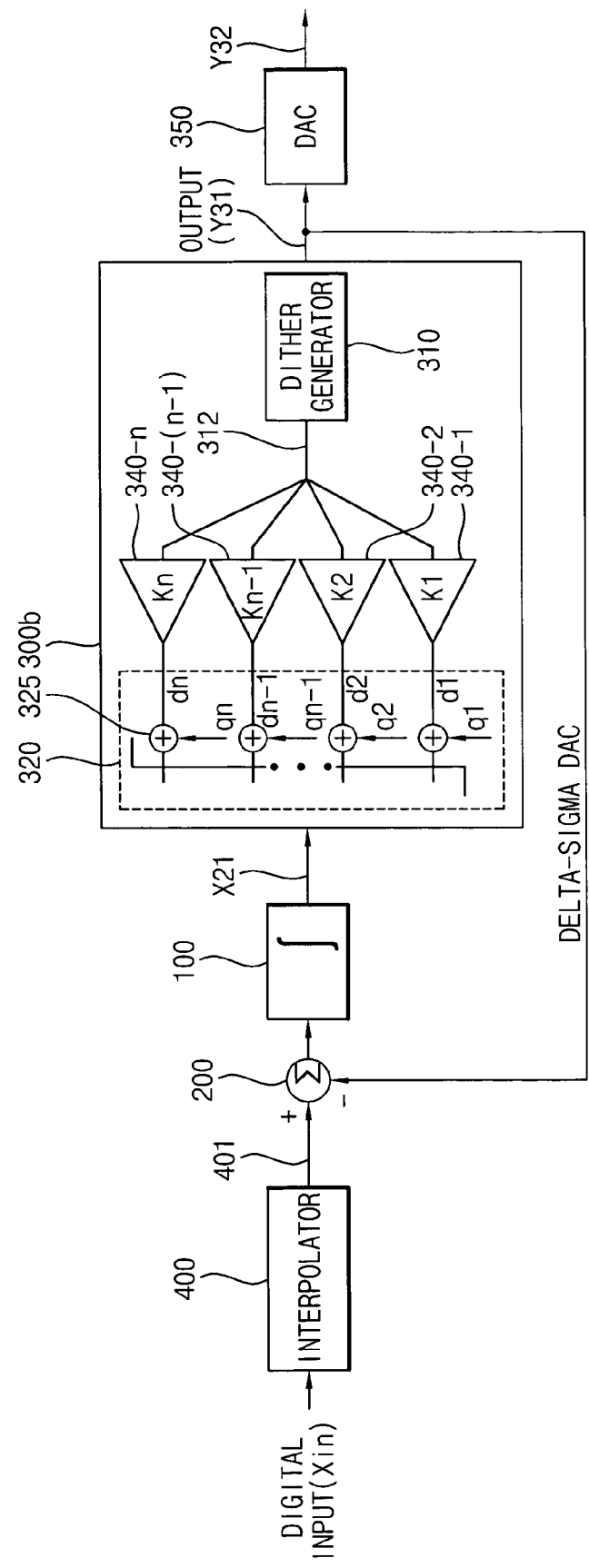
FIGS. 8A and 8B are block diagrams of delta-sigma digital-to-analog converter circuits in accordance with further embodiments of the present invention.

Referring to FIG. 7B, a converter 300b may be used in place of the converter 300a of FIG. 6 as shown in FIG. 8A in accordance with further embodiments of the present invention. The converter 300b includes a plurality of scaling units 340-1, 340-2, . . . 340-n that are configured to scale the first dither signal 312 by a plurality of scaling factors K1, K2, . . . Kn, respectively. The adder circuits 325 add the scaled dither signals to the $2^N$ quantization levels, respectively. In accordance with some embodiments, the plurality of scaling factors K1, K2, . . . Kn have different values from each other. In other embodiments, two or more of the plurality of scaling factors K1, K2, . . . Kn have the same value. In still other embodiments, scaling factors associated with quantization levels between a first threshold and a second threshold are greater than scaling factors associated with quantization levels less than the first threshold and greater than the second threshold. That is, the dither signal is scaled more for quantization levels in the middle of the quantization range than at those levels at the two extremes of the quantization range.

Figure 8B:
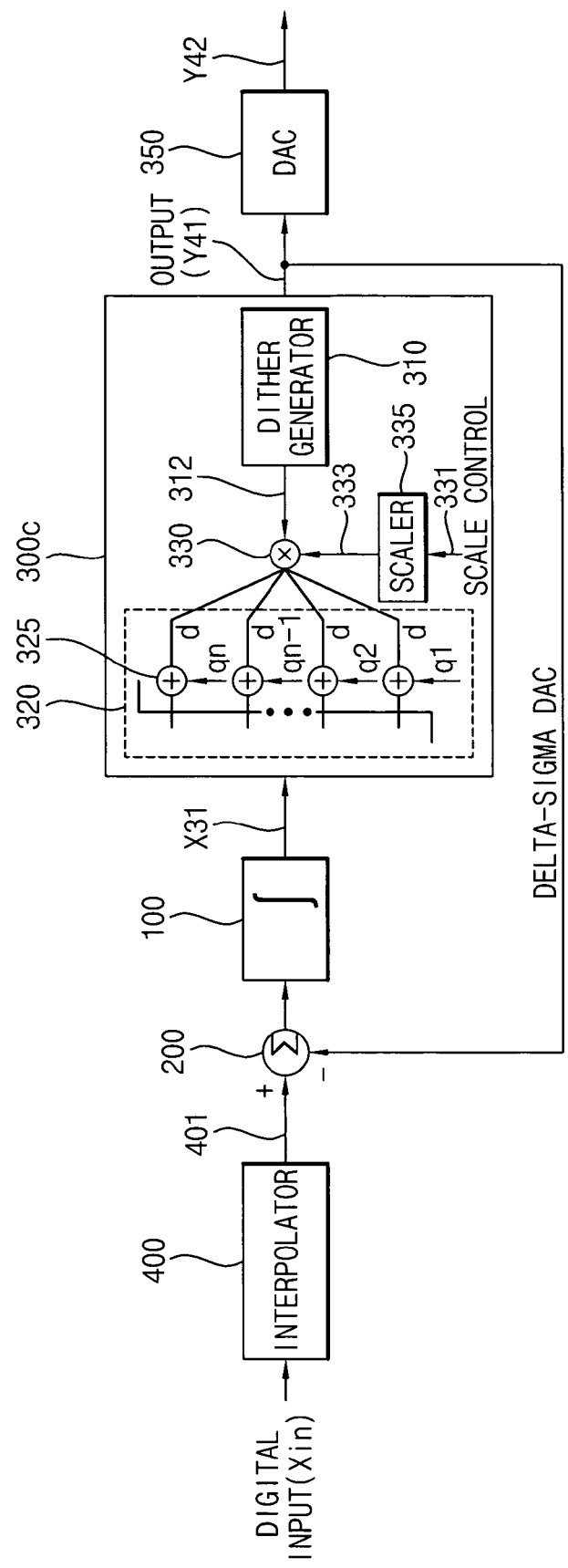

Referring to FIG. 7C, a converter 300c may be used in place of the converter 300 of FIG. 6 as shown in FIG. 8B in accordance with further embodiments of the present invention. The converter 300c is similar to the converter 300a of FIG. 7A with the exception that a scaler block 326 is used to generate the scaling factor 333 responsive to a scale control signal 331.

Returning to FIGS. 6, 8A, and 8B, the DAC 350 converts the quantized output of the converter 300* (Y21, Y31, Y41, respectively) to an analog signal Y22, Y32, Y42, respectively.

Advantageously, in the embodiments illustrated in FIGS. 6, 8A, and 8B, the dither is not added to the signal path, but is instead added to the quantization levels. As a result, there is no need to reduce the magnitude of the input signal so that the SNR at the input to the quantizer circuit is not reduced. Because the quantization level has relatively low resolution in contrast to the input signal resolution, the SNR does not decrease despite the added dither in the quantization levels. The delta-sigma modulator noise shapes the quantization noise in accordance with the integrator's or loop filter's 100 order m, where m is an integer greater than one in accordance with some embodiments of the present invention. The dither noise may have an associated dither transfer function H(z) where $H(z)=D(1-Z^-)^m$, where D is a frequency of the dither signal d. Because the dither transfer function is in the form of a high-pass filter, the dither noise is pushed out of band and the effect of idle channel noise and/or tone noise may be reduced in accordance with some embodiments of the present invention. The remaining dither noise after noise shaping has been applied may be quantization noise. By scaling the dither signal, it may be possible to reduce the tone noise.

In a conventional delta-sigma modulator circuit, the dither is not correlated to the loop filter's order. In accordance with some embodiments of the present invention, the dither is introduced in the quantizer where quantization noise is also incurred. As a result, if the characteristics of the loop filter are improved, the dither characteristics are also improved. Because it may be possible to control the dither signal via an external program using a scaling factor signal, the dither magnitude may be calibrated based on an analog device mismatch. As discussed above, the SNR may be reduced in conventional delta-sigma modulator circuits in which dither is introduced at the input of the quantizer circuit. In some embodiments of the present invention, SNR is not reduced because the dither range is between one least significant bit and the quantization level full range/$2^N$. Thus, it is possible to reduce tone noise with a larger dither range than that of a conventional quantizer circuit.

Figure 9A:
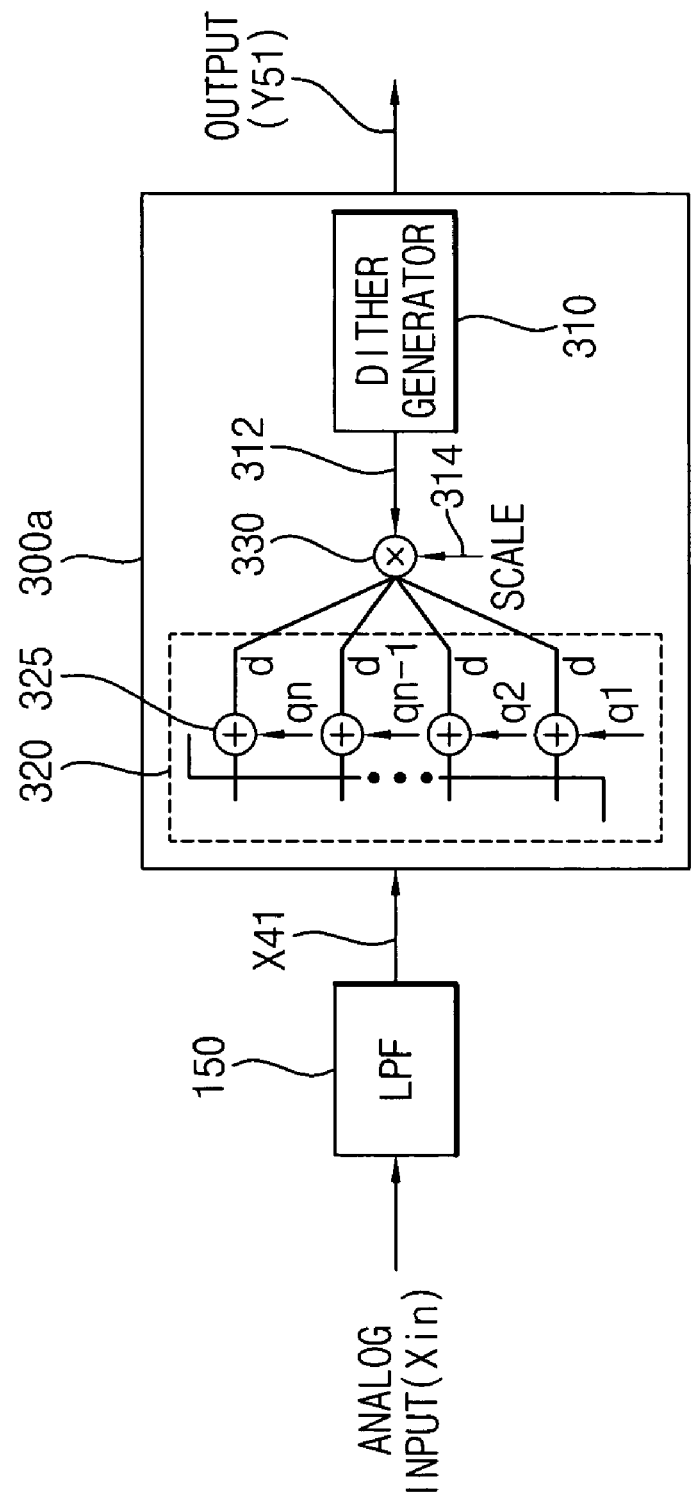
FIGS. 9A-9C are block diagrams of converter circuits for use in delta-sigma analog-to-digital converter circuits in accordance with various embodiments of the present invention.
Figure 9B:
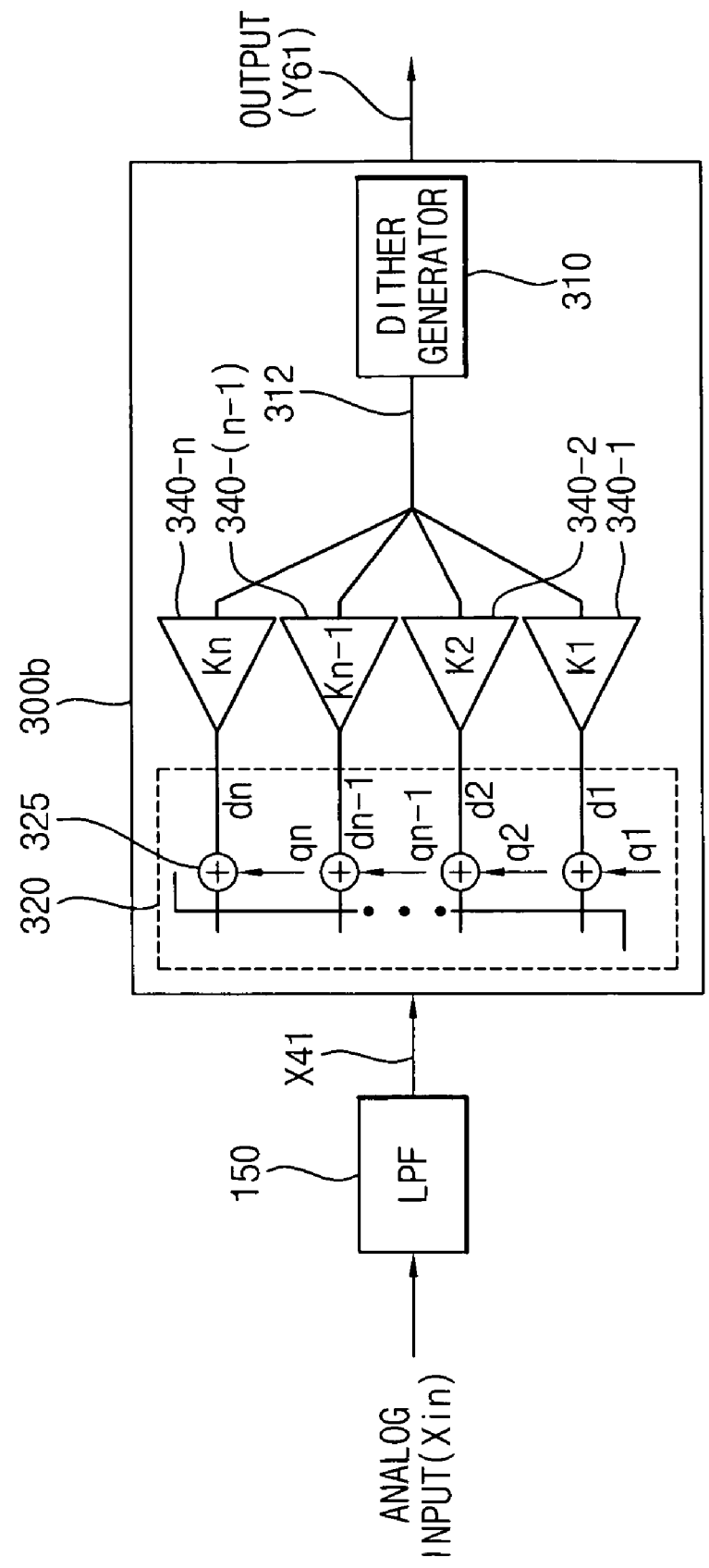
Figure 9C:
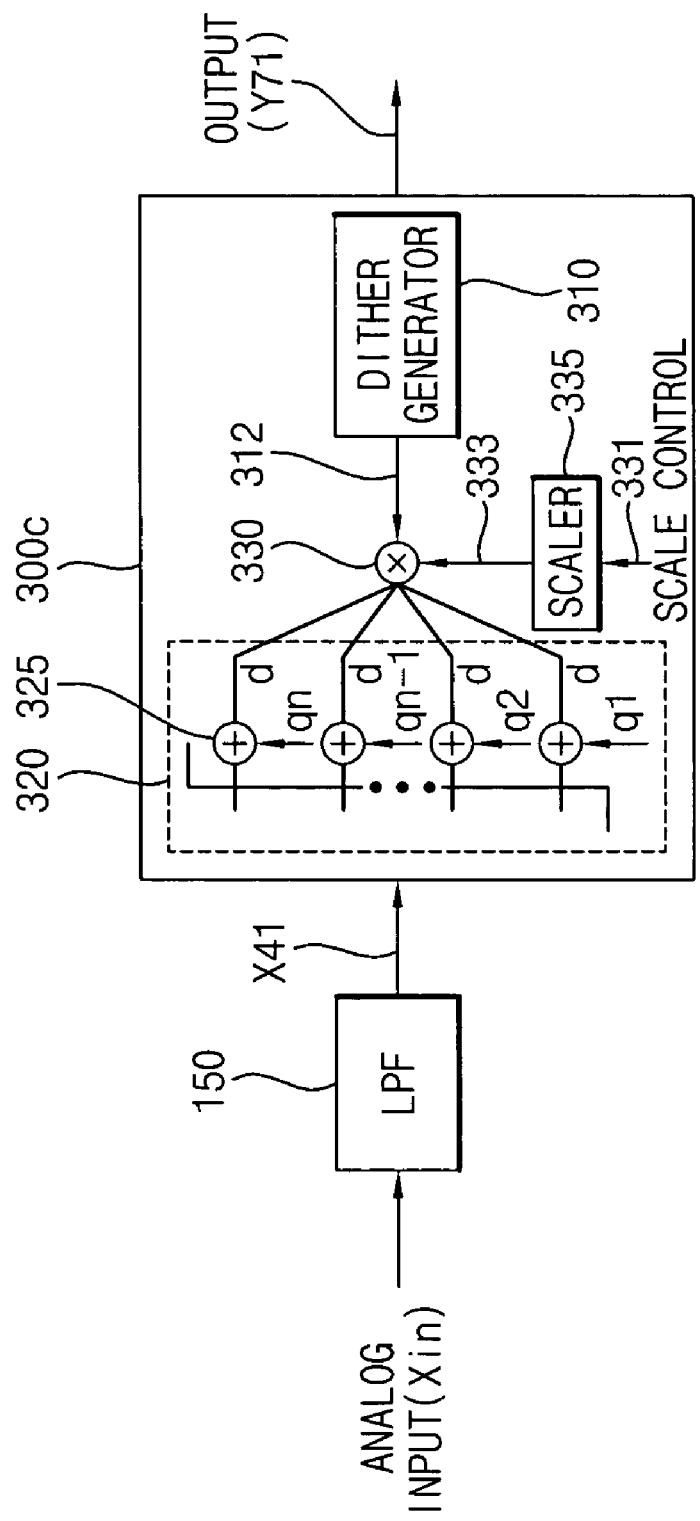

Some embodiments of the present invention have been discussed above with reference to a delta-sigma modulator DAC circuit. Similar embodiments will now be discussed with respect to a delta-sigma modulator analog-to-digital converter (ADC) circuit. FIGS. 9A-9C illustrate converters 300a-300c in accordance with various embodiments of the present invention. The converters may be viewed as n-level quantizer circuits. The configuration of the converters 300a-300c of FIGS. 9A-9C is the same as that of the converters 300a-300c of FIGS. 7A-7C with the exception that a low-pass filter (LPF) 150 is included. Moreover, operation of the converters 300a-300c of FIGS. 9A-9C is the same as that of the converters 300a-300c of FIGS. 7A-7C with the exception that the input signal is analog in FIGS. 9A-9C while it is digital in FIGS. 7A-7C.

Figure 10A:
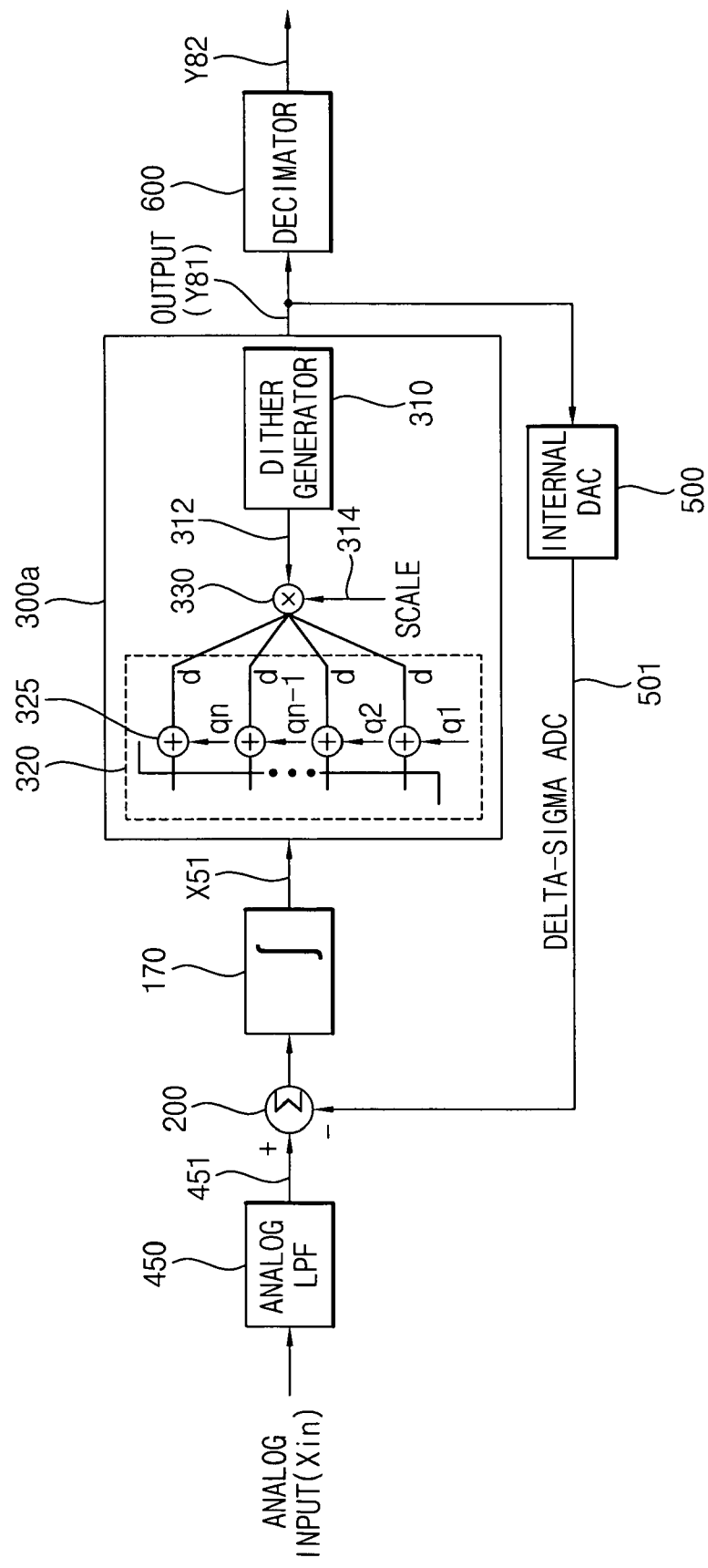
FIGS. 10A-10C are block diagrams of delta-sigma analog-to-digital converter circuits in accordance with further embodiments of the present invention.
Figure 10B:
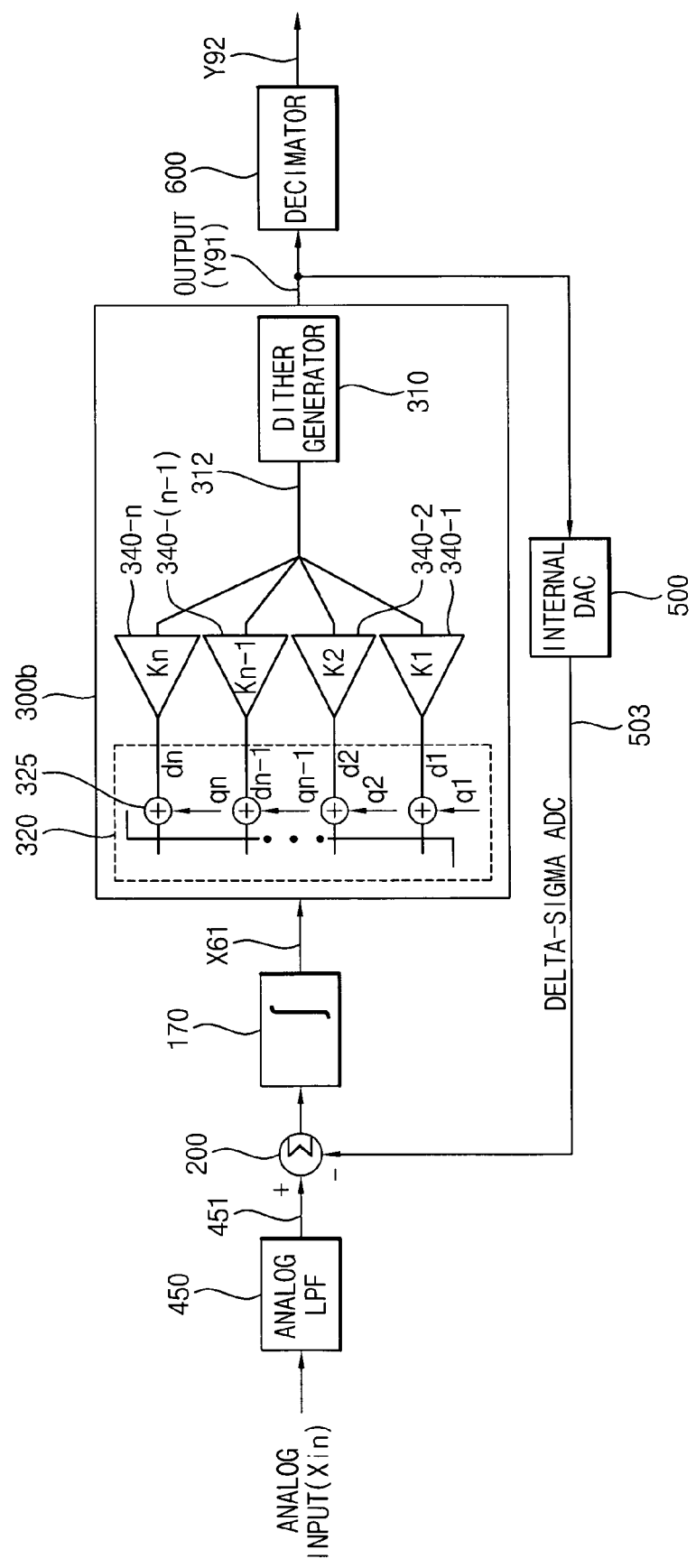
Figure 10C:
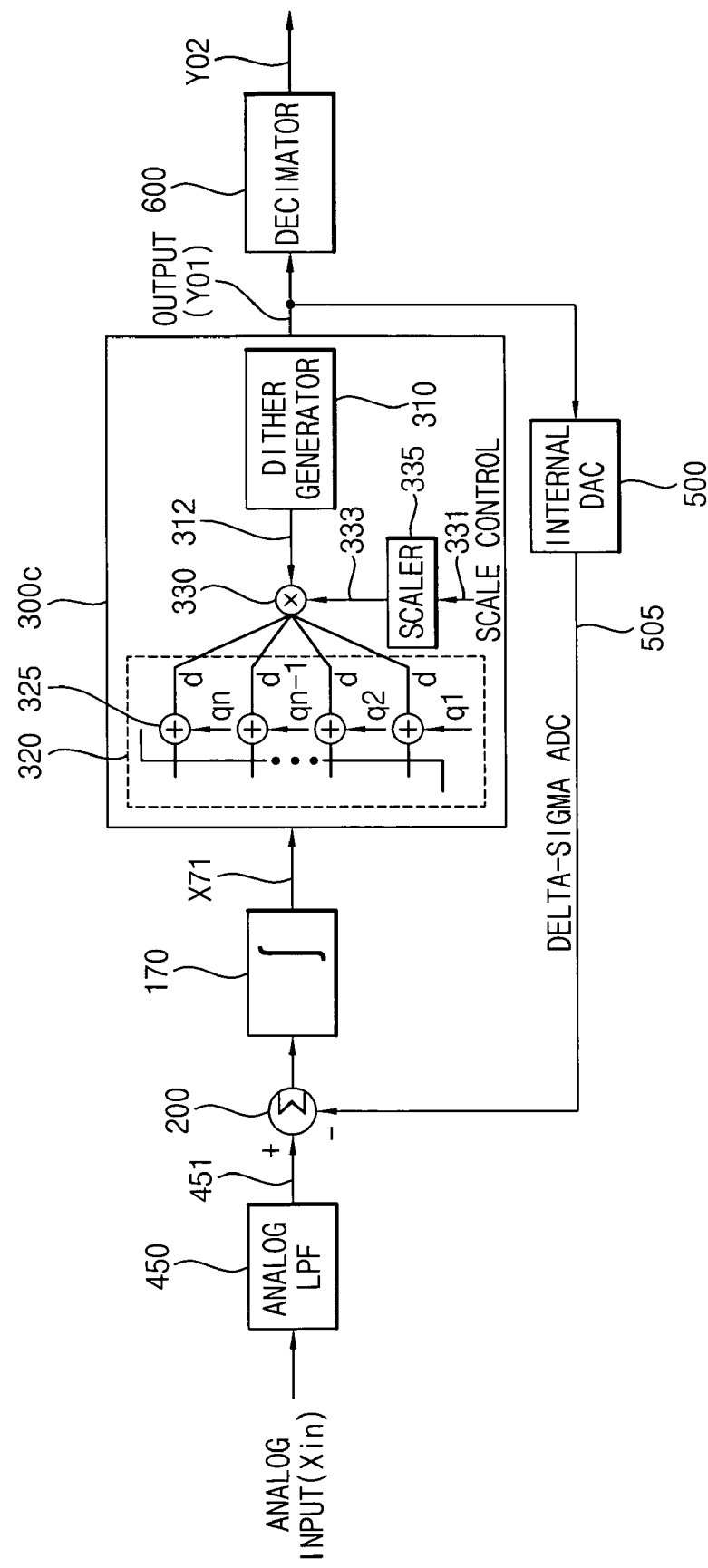

Delta-sigma modulator ADC circuits will now be described with reference to FIGS. 10A-10C. In particular, FIGS. 10A-10C are delta-sigma modulator ADC circuits that include the converters 300a-300c of FIGS. 9A-9C, respectively. A delta-sigma modulator ADC circuit includes an analog low-pass filter 450, a subtractor 200, an integrator or analog loop filter 170, a converter 300a-300c, an internal DAC, and a decimator 600 that are connected as shown in FIGS. 10A-10C. The decimator decimates the quantized output (Y81, Y91, Y01) of the converter circuit 300* and generates a digital output signal Y82, Y92, Y02. The characteristics and advantages of the delta-sigma modulator ADC circuits of FIGS. 10A-10C are similar to those of the delta-sigma modulator DAC circuits of FIGS. 6, 8A, and 8B.

Figure 11A:
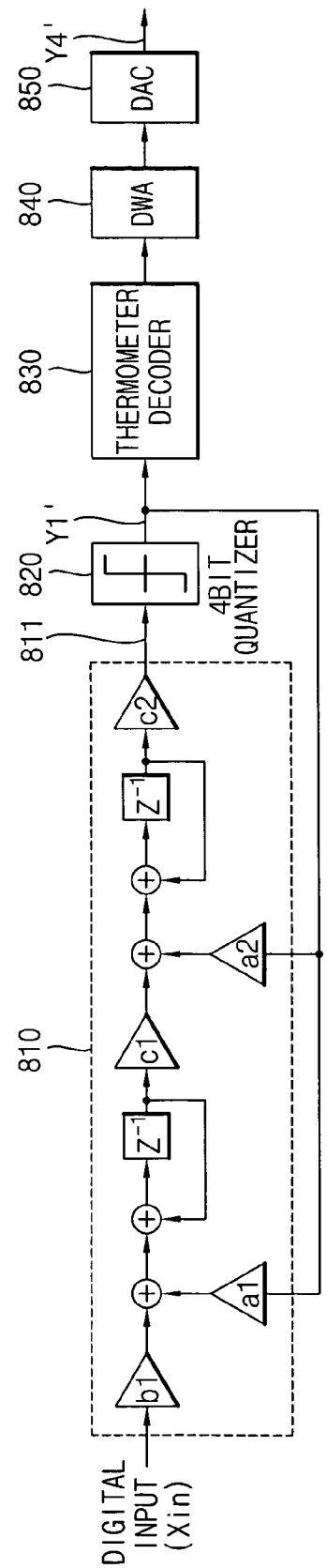
FIG. 11A is a delta-sigma digital-to-analog converter circuit used in a simulation.
Figure 11B:
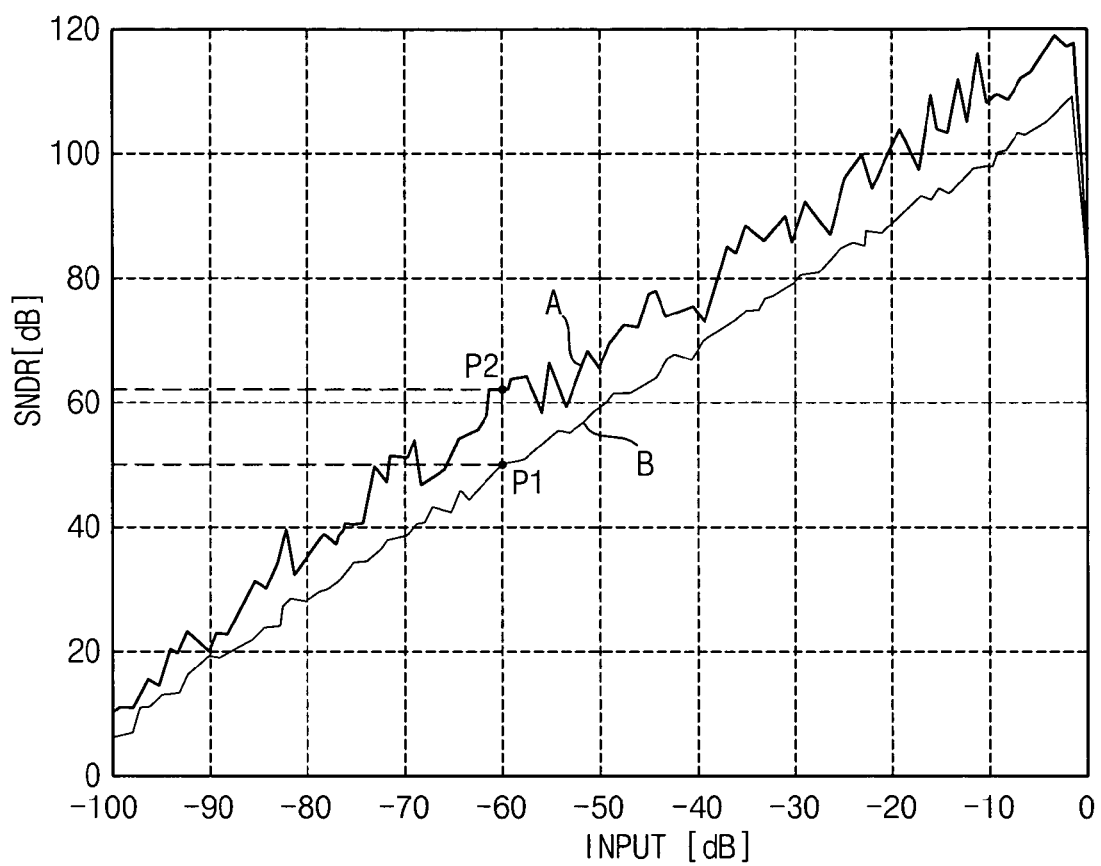
FIG. 11B is a graph of signal-to-noise ratio versus input signal for a conventional delta-sigma modulator circuit and a delta-sigma modulator circuit according to an embodiment of the present invention.

FIG. 11A illustrates a simulation circuit for a 4-bit delta-sigma DAC in which a 20 bit input signal, $2^{nd}$ order loop filter, and 4 bit quantizer are used and the analog device has a 0.1% mismatch. Thus, the circuit includes a loop filter 810, a quantizer 820, a thermometer decoder 830, a dynamic weight averaging (DWA) decoder 840, and a DAC 850. In a conventional structure, dither is added to the output of the loop filter 810 to signal 811. The dither amount is one least significant bit to minimize the reduction in SNR. According to some embodiments of the present invention, dither is added to 15 quantization levels so that the dither range is from −16384 to 16384 (full scale/$2^5$). As shown in FIG. 11B, when the input is −60 dB (1/1000), the conventional circuit has an SNR of 50 dB (P1), while an embodiment according to the present invention has an SNR of 60 dB (P2).

Figure 12A:
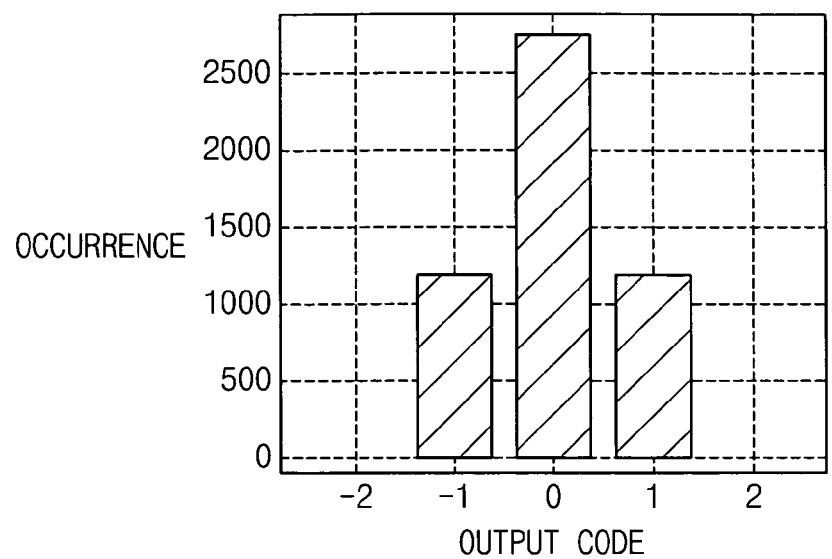
FIGS. 12A and 12B are histograms of output code versus quantization occurrence for a conventional delta-sigma modulator circuit and a delta-sigma modulator circuit according to an embodiment of the present invention.
Figure 12B:
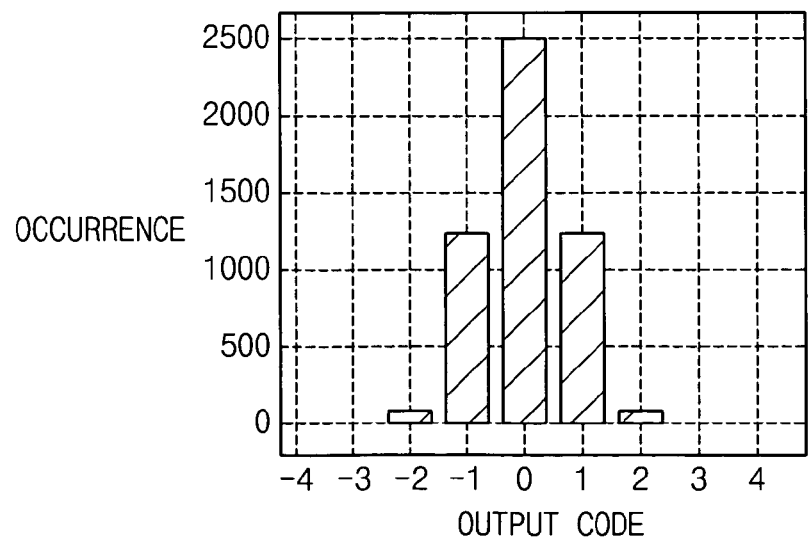

FIGS. 12A and 12B are histograms that plot output code versus quantizer occurrence for a conventional delta-sigma modulator and a delta-sigma modulator according to an embodiment of the present invention. The conventional circuit outputs only −1, 0, and 1 and the output of 0 occurs relatively frequently as shown in FIG. 12A. The circuit according to an embodiment of the present invention outputs −2, −1, 0, 1, and 2, and the occurrence of 0 is less than that of the conventional circuit as shown in FIG. 12B. Because the output is spread over more values, tone noise may be reduced in some embodiments of the present invention. Dither may be increased in the conventional circuit to reduce tone noise, but such an increase in dither reduces the SNR as discussed above.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A delta-sigma modulator circuit, comprising:
an n-level quantizer circuit that is configured to generate a quantized output signal responsive to an input signal, the n-level quantizer circuit comprising:
n adder circuits that are configured to add a dither signal to n quantization levels to generate n dithered quantization levels, respectively; and
n comparator circuits that are configured to compare the input signal with the n dithered quantization levels to generate the quantized output signal;
a dither generator that is configured to generate the dither signal; and
a scaling circuit that is configured to multiply the dither signal by a scaling factor to generate the scaled dither signal;
wherein the n adder circuits are configured to add the scaled dither signal to the n quantization levels to generate the n dither quantization levels, respectively.

2. The delta-sigma modulator circuit of claim 1, further comprising:
an integrator that is configured to integrate a difference between a modulator input signal and the quantized output signal to generate the input signal.

3. The delta-sigma modulator circuit of claim 2, wherein the integrator comprises a loop filter.

4. The delta-sigma modulator circuit of claim 2, further comprising:
an interpolator circuit that is configured to generate the modulator input signal responsive to a digital input signal.

5. The delta-sigma modulator circuit of claim 4, wherein the interpolator circuit comprises a digital low pass filter.

6. The delta-sigma modulator circuit of claim 1, further comprising:
a digital-to-analog converter (DAC) circuit that is configured to generate an analog output signal responsive to the quantized output signal.

7. The delta-sigma modulator circuit of claim 1, further comprising:
a scaler block that is configured to generate the scaling factor based on a scale control signal.

8. The delta-sigma modulator circuit of claim 1, wherein the scaling circuit comprises:
n scaling units that are associated with the n adder circuits, respectively, the n scaling units being configured to multiply the dither signal by n scaling factors to generate n scaled dither signals;
wherein the n adder circuits are further configured to add the n scaled dither signals to the n quantization levels to generate the n dithered quantization levels.

9. The delta-sigma modulator circuit of claim 8, wherein the n scaling factors have different values.

10. The delta-sigma modulator circuit of claim 8, wherein at least two of the n scaling factors have a same value.

11. The delta sigma modulator circuit of claim 8, wherein scaling factors associated with quantization levels between a first threshold and a second threshold are greater than scaling factors associated with quantization levels less than the first threshold and greater than the second threshold.

12. The delta-sigma modulator circuit of claim 1, wherein the dither signal comprises non-periodic pseudo random noise.

13. The delta-sigma modulator circuit of claim 1, further comprising:

a digital-to-analog converter (DAC) that is configured to generate an analog output signal responsive to the quantized output signal; and
an integrator that is configured to integrate a difference between a modulator input signal and the analog output signal to generate the input signal.

14. The delta-sigma modulator circuit of claim 13, wherein the integrator comprises a loop filter.

15. The delta-sigma modulator circuit of claim 13, further comprising:
an analog low pass filter that is configured to generate the modulator input signal responsive to an analog input signal.

16. The delta-sigma modulator circuit of claim 1, further comprising:
a decimator circuit that is configured to generate a digital output signal responsive to the quantized output signal.

17. The delta-sigma modulator circuit of claim 16, wherein the decimator circuit comprises a digital low pass filter.

18. A method of operating a delta-sigma modulator, comprising:
generating a dither signal;
multiplying the dither signal by a scaling factor to generate a scaled dither signal;
generating a quantized output signal responsive to an input signal, comprising:
adding the scaled dither signal to n quantization levels to generate n dithered quantization levels, respectively; and
comparing the input signal with the n dithered quantization levels to generate the quantized output signal.

19. The method of claim 18, further comprising:
integrating a difference between a modulator input signal and the quantized output signal to generate the input signal.

20. The method of claim 18, further comprising:
interpolating a digital input signal to generate the modulator input signal.

21. The method of claim 18, further comprising:
converting the quantized output signal to an analog output signal.

22. The method of claim 18, further comprising:
generating the scaling factor based on a scale control signal.

23. The method of claim 18, wherein multiplying the dither signal by the scaling factor comprises:
multiplying the dither signal by n scaling factors to generate n scaled dither signals;
wherein adding the scaled dither signal to the n quantization levels comprises:
adding the n scaled dither signals to the n quantization levels to generate the n dithered quantization levels.

24. The method of claim 23, wherein the n scaling factors have different values.

25. The method of claim 23, wherein at least two of the n scaling factors have a same value.

26. The method of claim 23, wherein scaling factors associated with quantization levels between a first threshold and a second threshold are greater than scaling factors associated with quantization levels less than the first threshold and greater than the second threshold.

27. The method of claim 18, wherein the dither signal comprises non-periodic pseudo random noise.

28. The method of claim 18, further comprising:
converting the quantized output signal to an analog output signal; and integrating a difference between a modulator input signal and the analog output signal to generate the input signal.

29. The method of claim 28, further comprising:
low pass filtering an analog input signal to generate the modulator input signal.

30. The method of claim 18, further comprising:
generating a digital output signal responsive to the quantized output signal.

* * * * *

UNITED STATES PATENT AND TRADEMARK OFFICE
CERTIFICATE OF CORRECTION

PATENT NO.         : 7,471,223 B2  
APPLICATION NO.    : 11/506515  
DATED              : December 30, 2008  
INVENTOR(S)        : Lee Page 1 of 1

It is certified that error appears in the above-identified patent and that said Letters Patent is hereby corrected as shown below:

On the Title Page and Column 1, Lines 1-4:

Please correct Item 54 to read as -- DELTA-SIGMA MODULATOR CIRCUITS IN WHICH DITHER IS ADDED TO THE QUANTIZATION LEVELS AND METHODS OF OPERATING THE SAME --

In the Claims:

Column 9, Claim 1, Line 19: Please correct "the n dither"
To read -- the n dithered --

Signed and Sealed this

Seventeenth Day of February, 2009

JOHN DOLL  
*Acting Director of the United States Patent and Trademark Office*